US012757465B2

(12) United States Patent
Shibata et al.

(10) Patent No.: US 12,757,465 B2
(45) Date of Patent: Oct. 6, 2026

(54) NITRIDE SEMICONDUCTOR DEVICE

(71) Applicant: Panasonic Holdings Corporation, Osaka (JP)

(72) Inventors: Daisuke Shibata, Kyoto (JP); Satoshi Tamura, Osaka (JP); Naoki Torii, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 323 days.

(21) Appl. No.: 18/671,465

(22) Filed: May 22, 2024

(65) Prior Publication Data

US 2024/0313061 A1 Sep. 19, 2024

Related U.S. Application Data

(63) Continuation of application No. PCT/JP2022/029063, filed on Jul. 28, 2022.

(30) Foreign Application Priority Data

Dec. 16, 2021 (JP) ................................ 2021-204400

(51) Int. Cl.
*H10D 62/85* (2025.01)
*H10D 30/47* (2025.01)
(Continued)

(52) U.S. Cl.
CPC ....... *H10D 62/8503* (2025.01); *H10D 30/475* (2025.01); *H10D 62/102* (2025.01);
(Continued)

(58) Field of Classification Search
CPC . H10D 62/8503; H10D 64/258; H10D 62/102
(Continued)

(56) References Cited

U.S. PATENT DOCUMENTS 9,773,899 B2 * 9/2017 Takeuchi ........... H10D 30/4735
2015/0228786 A1 * 8/2015 Yi .......................... H10D 30/60 257/330

(Continued)

FOREIGN PATENT DOCUMENTS

JP 6511645 B2 5/2019
WO 2015/122135 A1 8/2015

(Continued)

OTHER PUBLICATIONS

International Search Report dated Oct. 11, 2022 issued in International Patent Application No. PCT/JP2022/029063, with English translation.

*Primary Examiner* — Jami Valentine Miller
(74) *Attorney, Agent, or Firm* — Rimon P.C.

(57) ABSTRACT

A nitride semiconductor device includes a substrate, a first semiconductor layer of a first conductivity type, a second semiconductor layer of a second conductivity type, a third semiconductor layer that has a resistance higher than that of the second semiconductor layer, and a fourth semiconductor layer of the second conductivity type that are arranged sequentially from a lower side; a fifth semiconductor layer including a channel region of the first conductivity type, a portion of the fifth semiconductor layer being disposed along the inner surface of a first opening and the other portion of the fifth semiconductor layer being disposed above the fourth semiconductor layer, the first opening penetrating through the fourth semiconductor layer, the third semiconductor layer, and the second semiconductor layer; a sixth semiconductor layer of the second conductivity type disposed above the fifth semiconductor layer; a gate electrode; a source electrode; and a drain electrode.

9 Claims, 6 Drawing Sheets

(51) Int. Cl.

| | |
|---|---|
| ***H10D 62/10*** | (2025.01) |
| ***H10D 62/854*** | (2025.01) |
| ***H10D 64/23*** | (2025.01) |
| ***H10W 44/00*** | (2026.01) |

(52) U.S. Cl.
CPC ......... *H10D 62/854* (2025.01); *H10D 64/258* (2025.01); *H10W 44/401* (2026.01)

(58) Field of Classification Search
USPC .......................................................... 257/288
See application file for complete search history.

(56) References Cited

U.S. PATENT DOCUMENTS

| | | | |
|---|---|---|---|
| 2016/0329421 A1 | 11/2016 | Shibata et al. | |
| 2017/0373200 A1 | 12/2017 | Shibata et al. | |
| 2021/0265337 A1* | 8/2021 | Hwang ............ | H03K 19/00361 |
| 2022/0059660 A1* | 2/2022 | Shibata ................ | H10D 30/477 |
| 2022/0406926 A1* | 12/2022 | Bakeroot ............. | H10D 30/475 |
| 2024/0313061 A1* | 9/2024 | Shibata ................ | H10D 30/051 |

FOREIGN PATENT DOCUMENTS

| | | | | |
|---|---|---|---|---|
| WO | 2016/147541 A1 | 9/2016 | | |
| WO | WO-2020137303 A1 * | 7/2020 | ......... | H10D 62/8503 |

* cited by examiner

NITRIDE SEMICONDUCTOR DEVICE

CROSS REFERENCE TO RELATED APPLICATIONS

This is a continuation application of PCT International Application No. PCT/JP2022/029063 filed on Jul. 28, 2022, designating the United States of America, which is based on and claims priority of Japanese Patent Application No. 2021-204400 filed on Dec. 16, 2021. The entire disclosures of the above-identified applications, including the specifications, drawings and claims are incorporated herein by reference in their entirety.

FIELD

The present disclosure relates to a nitride semiconductor device.

BACKGROUND

Nitride semiconductors such as gallium nitride (GaN) are wide-bandgap semiconductors having a large bandgap and high dielectric breakdown field strength, in which the saturated drift rate of electrons is higher than those of gallium arsenide (GaAs) semiconductors or silicon (Si) semiconductors. For this reason, power transistors using nitride semiconductors that are advantageous in an increase in output and an increase in breakdown voltage have been studied and developed.

For example, Patent Literature (PTL) 1 and PTL 2 each disclose a vertical field effect transistor (FET) including a regrowth layer located to cover an opening disposed in a GaN-based laminate, and a gate electrode located above the regrowth layer along the regrowth layer. The channel is formed by a two-dimensional electron gas (2DEG) generated in the regrowth layer.

CITATION LIST

Patent Literature

PTL 1: WO 2020/137303
PTL 2: Japanese Patent No. 6511645

SUMMARY

Technical Problem

The electrical properties of the traditional semiconductor devices described above can be improved upon.

Solution to Problem

The present disclosure provides a nitride semiconductor device having improved electrical properties.

The nitride semiconductor device according to one aspect of the present disclosure includes a substrate; a first semiconductor layer of a first conductivity type disposed above the substrate; a second semiconductor layer of a second conductivity type disposed above the first semiconductor layer; a third semiconductor layer that is disposed above the second semiconductor layer and has a resistance higher than a resistance of the second semiconductor layer; a fourth semiconductor layer of the second conductivity type disposed above the third semiconductor layer; a fifth semiconductor layer including a channel region of the first conductivity type, a portion of the fifth semiconductor layer being disposed along an inner surface of a first opening and an other portion of the fifth semiconductor layer being disposed above the fourth semiconductor layer, the first opening penetrating through the fourth semiconductor layer, the third semiconductor layer, and the second semiconductor layer and reaching the first semiconductor layer; a sixth semiconductor layer of the second conductivity type disposed above the fifth semiconductor layer; a gate electrode disposed above the sixth semiconductor layer; a source electrode spaced from the gate electrode; and a drain electrode disposed below a bottom surface of the substrate.

Advantageous Effects

The present disclosure can provide a nitride semiconductor device having improved electrical properties.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
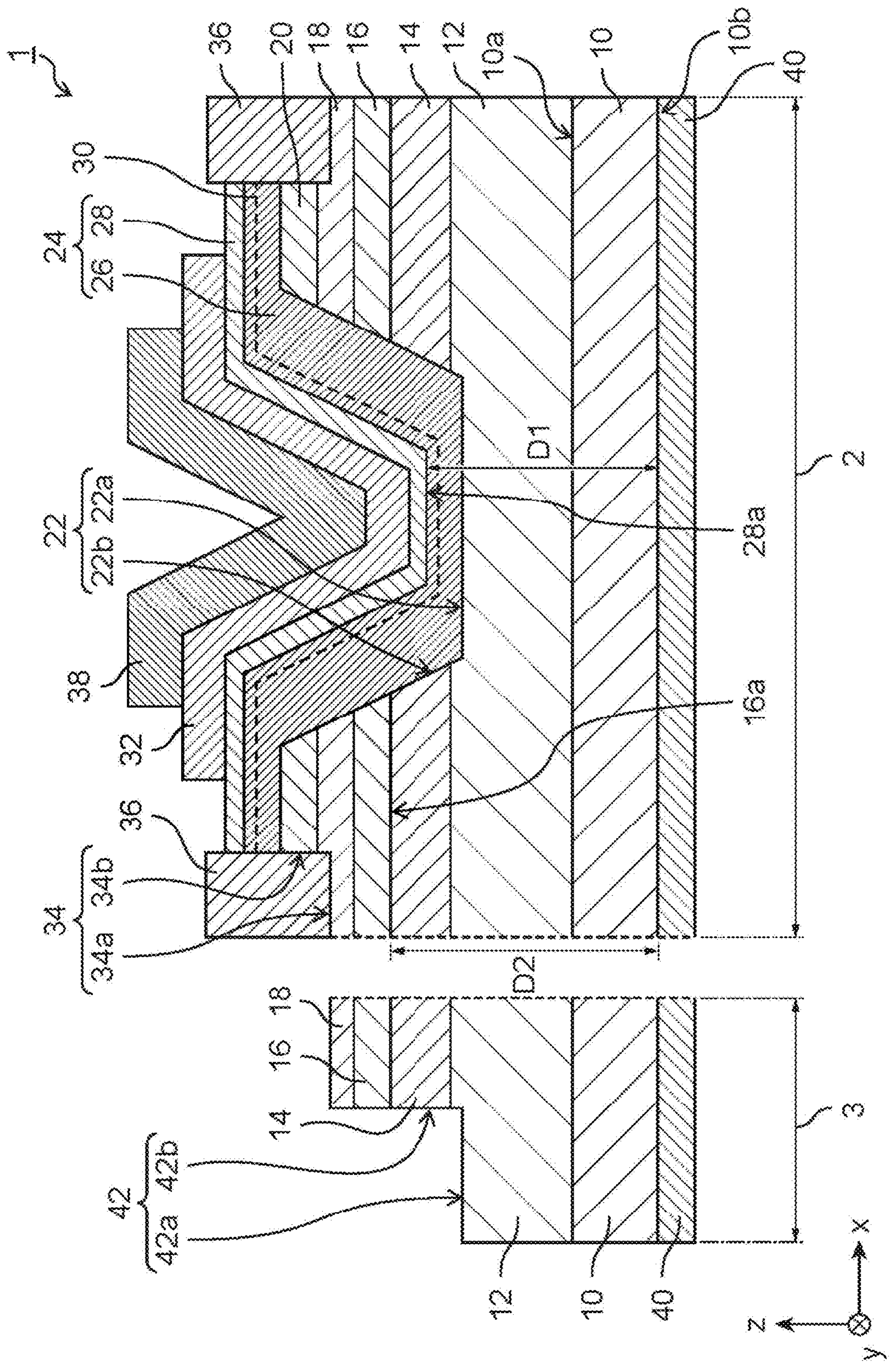
FIG. 1 is a cross-sectional view of the nitride semiconductor device according to Embodiment 1.

Underlying Knowledge Forming Basis of the Present Disclosure

The present inventors have found that the traditional nitride semiconductor devices described in "Background" have the following problems.

In the nitride semiconductor devices disclosed in PTLs 1 and 2, a high-resistance GaN layer is disposed between the p-type basecoat layer and the channel to avoid formation of a parasitic npn bipolar structure by the n-type drift layer, the p-type basecoat layer, and the n-type channel (two-dimensional electron gas). Thereby, the off properties of the transistor are improved.

However, electrons in the channel may be trapped by this high-resistance GaN layer during switching operation. This is because carbon (C) or iron (Fe) with which the high-resistance GaN layer is doped generates the trap level. Trap of electrons may cause a reduction in the dynamic characteristics of the transistor.

Thus, the present disclosure provides a nitride semiconductor device including a transistor having improved off properties while a reduction in dynamic characteristics is suppressed.

The nitride semiconductor device according to one aspect of the present disclosure includes a substrate; a first semiconductor layer of a first conductivity type disposed above the substrate; a second semiconductor layer of a second conductivity type disposed above the first semiconductor layer; a third semiconductor layer that is disposed above the second semiconductor layer and has a resistance higher than a resistance of the second semiconductor layer; a fourth semiconductor layer of the second conductivity type disposed above the third semiconductor layer; a fifth semiconductor layer including a channel region of the first conductivity type, a portion of the fifth semiconductor layer being disposed along an inner surface of a first opening and an other portion of the fifth semiconductor layer being disposed above the fourth semiconductor layer, the first opening penetrating through the fourth semiconductor layer, the third semiconductor layer, and the second semiconductor layer and reaching the first semiconductor layer; a sixth semiconductor layer of the second conductivity type disposed above the fifth semiconductor layer; a gate electrode disposed above the sixth semiconductor layer; a source electrode spaced from the gate electrode; and a drain electrode disposed below a bottom surface of the substrate.

Such a configuration, in which the fourth semiconductor layer is disposed above the high-resistance third semiconductor layer, obstructs trap of electrons at the trap level generated in the third semiconductor layer. Thus, a reduction in dynamic characteristics of the transistor can be suppressed.

Even if the purpose is only for suppressing trap of electrons, it can also be assumed that the high-resistance third semiconductor layer is disposed in the pn bonding portion of the lowermost layer (specifically, in contact with the top surface of the first semiconductor layer). However, the crystal quality of the high-resistance third semiconductor layer 16 tends to be reduced due to doping with carbon or the like. For this reason, the off properties may be reduced when the high-resistance third semiconductor layer is disposed in the pn bonding portion to which a high electric field is applied when the device is off. In contrast, in the nitride semiconductor device according to according to the present aspect, the second semiconductor layer is disposed below the third semiconductor layer, and the pn junction is formed by the second semiconductor layer and the first semiconductor layer. Thus, the off properties can be improved.

Moreover, for example, the fifth semiconductor layer may include an electron mobility layer, and an electron supply layer disposed above the electron mobility layer, and a distance between a bottom of the electron supply layer and the drain electrode may be shorter than a distance between a bottom of the third semiconductor layer and the drain electrode.

The electron mobility layer and the electron supply layer can be continuously formed by crystal growth. For this reason, the pn bonding portion at the interface between the electron mobility layer and the electron supply layer (namely, the pn bonding portion of the gate portion) is a portion that can endure the highest electric field strength within the nitride semiconductor device with few levels attributed to impurities or damage. By disposing the pn bonding portion of the gate portion close to the drain electrode, the electric field generated between the gate electrode or source electrode and the drain electrode when the device is off can be concentrated on the pn bonding portion of the gate portion. Thereby, concentration of the electric field on weak portions can be suppressed, and the off properties can be improved.

Moreover, for example, in the nitride semiconductor device according to one aspect of the present disclosure, the source electrode may be disposed along an inner surface of a second opening that is spaced from the gate electrode, and penetrates through the fifth semiconductor layer and reaches the fourth semiconductor layer.

In such a configuration, where the channel is exposed from the inner surface of the second opening, this exposed portion of the source electrode can be in contact with the channel. For this reason, the ohmic contact resistance between the source electrode and the channel can be reduced. Since the high-resistance third semiconductor layer is disposed below the fourth semiconductor layer that is in contact with the source electrode on the bottom of the second opening, flow of a current in the parasitic pn diode formed between the source and the drain can be suppressed. Such a configuration can improve the reliability of the nitride semiconductor device.

Moreover, for example, in the nitride semiconductor device according to one aspect of the present disclosure, the source electrode may be disposed along an inner surface of a third opening that is spaced from the gate electrode, and penetrates through the fifth semiconductor layer, the fourth semiconductor layer, and the third semiconductor layer, and reaches the second semiconductor layer.

In such a configuration, where the channel is exposed from the inner surface of the third opening, this exposed portion of the source electrode can be in contact with the channel. For this reason, the ohmic contact resistance between the source electrode and the channel can be reduced. Since the source electrode is in contact with both of the fourth semiconductor layer and the second semiconductor layer, the potentials of the semiconductor layers can be firmly fixed. Thereby, the off properties of the nitride semiconductor device can be further improved.

Moreover, for example, the third semiconductor layer may contain at least one of C, Fe, B, or Mg.

In such a configuration, the high-resistance third semiconductor layer can be simply formed by doping during crystal growth or ion injection after growth.

Moreover, for example, the first semiconductor layer may include layers having different impurity concentrations, and a topmost layer of the layers may have a lowest impurity concentration among the layers.

In such a configuration, where the impurity concentration is reduced near the pn bonding portion between the first semiconductor layer and the second semiconductor layer, concentration of the electric field when the device is off can be relaxed. This can enhance the off properties of the nitride semiconductor device.

Moreover, for example, a bottom of the first opening may be located in a position corresponding to an n-th layer from above among the layers, where n is a natural number of 2 or more.

In such a configuration, the off properties can be improved while an increase in on-resistance is suppressed. Specifically, the layer with a low impurity concentration that is located in the topmost layer of the first semiconductor layer contributes to an improvement in off properties. On the other hand, because the layer with a low impurity concentration has a high resistance, the on-resistance is increased when the layer is included in the current path when the device is on. In contrast, because the bottom of the first opening penetrates through the layer with a low impurity concentration that is located in the topmost layer of the first semiconductor layer, the layer with a low impurity concentration can be excluded from the current path when the device is on. Thus, the on-resistance can be reduced.

To be noted, in the gate portion, the layer with a low impurity concentration does not contribute to an improvement in off properties. However, in the gate portion, the electric field can be received by the pn bonding portion at the interface between the electron mobility layer and the electron supply layer. Thus, a reduction in the off properties can be suppressed. This is because the pn bonding portion in the gate portion is a portion that can endure the highest electric field strength within the nitride semiconductor device.

Moreover, for example, a groove portion that reaches the first semiconductor layer may be disposed in an end portion of the nitride semiconductor device. Moreover, for example, a distance between the bottom of the first opening and the drain electrode may be shorter than a distance between a bottom of the groove portion and the drain electrode.

In such a configuration, a reduction in the off properties can be suppressed. The groove portion in the device end portion is likely to be subjected to etching damage during formation, and the electric field strength which the groove portion can endure may be insufficient in some cases. By disposing the pn bonding portion of the gate portion close to the drain electrode, the electric field when the device is off can be received by the pn bonding portion of the gate portion, thus suppressing a reduction in off properties.

Hereinafter, embodiments will be specifically described with reference to the drawings.

The embodiments described below all illustrate general or specific examples. Numeric values, shapes, materials, components, arrangement positions of components and connection forms thereof, steps, order of steps, and the like shown in embodiments below are exemplary, and should not be construed as limitations to the present disclosure. Moreover, among the components of the embodiments below, the components not described in an independent claim will be described as optional components.

The drawings are schematic views, and are not necessarily precise illustrations. Accordingly, for example, the scale is not always consistent among the drawings. In the drawings, identical reference signs are given to substantially identical configurations, and duplications of descriptions thereof will be omitted or simplified.

In this specification, terms representing relations between entities, such as parallel or orthogonal, terms representing shapes of entities, such as rectangular or trapezoidal, and ranges of numeric values are not expressions indicating only their strict meanings, but are expressions containing substantially equivalent ranges, for example, differences of about several percent.

In this specification and the drawings, the x-axis, the y-axis, and the z-axis represent three axes in a three-dimensional orthogonal coordinate frame. When the shape of a substrate in planar view is a rectangular shape, the x-axis and the y-axis are a direction parallel to a first side of the rectangular shape and a direction parallel to a second side orthogonal to the first side, respectively. The z-axis is a thickness direction of the substrate. In this specification, the "thickness direction" of the substrate refers to a direction vertical to a main surface of the substrate. The thickness direction is identical to the stack direction of semiconductor layers, and is also referred to as "longitudinal direction". Moreover, a direction parallel to the main surface of the substrate may be referred to as "traverse direction" in some cases.

The side of the substrate (positive side of the z-axis) on which the gate electrode and source electrode are arranged is regarded as "above" or "upper side", and the side of the substrate on which the drain electrode is disposed (negative side of the z-axis) is regarded as "below" or "lower side".

In this specification, the terms "above" and "below" are used as terms defined by a relatively positional relation based on the stacking order in the stack configuration, but not those indicating an upper direction (vertically upper) and a lower direction (vertically lower) in absolute spatial recognition. The terms "above" and "below" are also applied not only in cases where two components are arranged with an interval and a different component is present between the two components, but also in cases where two components are arranged to be adjacent to and be in contact with each other.

In this specification, "in planar view" indicates viewing in a direction vertical to a main surface of the substrate of the nitride semiconductor device, namely, viewing the main surface of the substrate from its front.

In this specification, unless otherwise specified, ordinal numbers such as "first" and "second" do not mean the number or order of components, but are used to avoid confusion of similar components and distinguish those components.

In this specification, AlGaN represents ternary mixed crystal $Al_xGa_{1-x}N$ (where $0<x<1$). Hereinafter, multinary mixed crystals are each abbreviated to an arrangement of symbols for constitutional elements, such as AlInN or GaInN. For example, $Al_xGa_{1-x-y}In_yN$ (where $0<x<1$, $0<y<1$, and $0<x+y<1$) as one example of the nitride semiconductor is abbreviated to AlGaInN.

Embodiment 1

Outline

First, the outline of the nitride semiconductor device according to Embodiment 1 will be described with reference to FIGS. 1 and 2.

FIG. 1 is a cross-sectional view of nitride semiconductor device 1 according to the present embodiment. FIG. 2 is a plan view of nitride semiconductor device 1 according to the present embodiment. FIG. 1 represents the cross-section taken along line I-I in FIG. 2. FIG. 1 schematically illustrates transistor portion 2 separated from end portion 3.

As illustrated in FIG. 1, nitride semiconductor device 1 includes transistor portion 2 and end portion 3. Specifically, nitride semiconductor device 1 includes substrate 10, drift layer 12, first basecoat layer 14, intermediate high-resistance layer 16, second basecoat layer 18, third basecoat layer 20, gate opening 22, semiconductor laminate film 24, threshold adjustment layer 32, source opening 34, source electrode 36, gate electrode 38, and drain electrode 40. Semiconductor laminate film 24 is a laminate of electron mobility layer 26 and electron supply layer 28, and includes two-dimensional electron gas (2 DEG) 30 as a channel region. Nitride semiconductor device 1 also includes groove portion 42 disposed in end portion 3.

Figure 2:
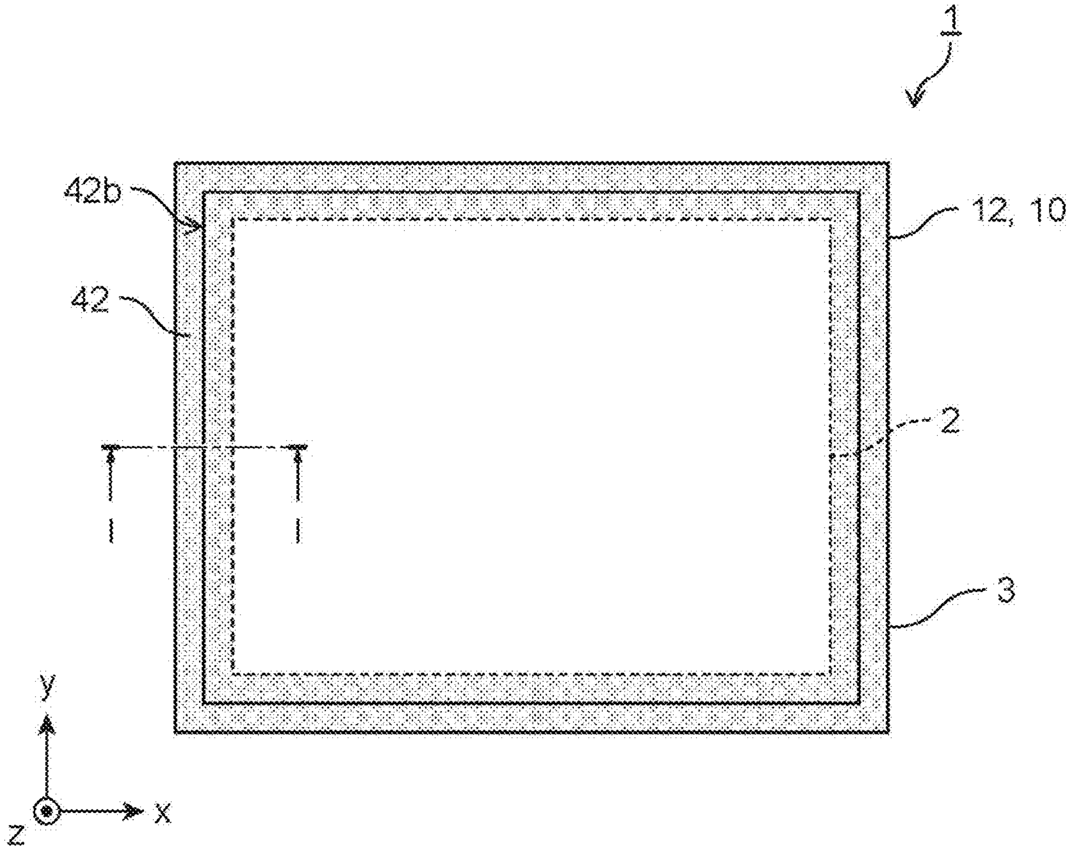
FIG. 2 is a plan view of the nitride semiconductor device according to Embodiment 1.

Transistor portion 2 is a region including an FET, in which the center of nitride semiconductor device 1 is included as illustrated in FIG. 2. Specifically, transistor portion 2 in planar view is a region in which third basecoat layer 20, gate opening 22, semiconductor laminate film 24, threshold adjustment layer 32, source electrode 36, or gate electrode 38 is disposed.

In FIG. 2, illustration of the components arranged in transistor portion 2 is omitted. As one example, source electrodes 36 having an elongated shape in one direction in planar view are arranged to form stripes, and gate electrode 38, threshold adjustment layer 32, and gate opening 22 are arranged between adjacent source electrodes 36. Alternatively, source electrodes 36 having a hexagonal shape in planar view may be spaced from each other to fill the plane.

End portion 3 is a region other than transistor portion 2, and is disposed like a ring to surround transistor portion 2. End portion 3 does not include third basecoat layer 20, gate opening 22, semiconductor laminate film 24, threshold adjustment layer 32, source electrode 36, and gate electrode 38.

In the present embodiment, nitride semiconductor device 1 is a device having a stack structure of semiconductor layers each containing a nitride semiconductor, such as GaN or AlGaN, as the main component. Specifically, nitride semiconductor device 1 has a hetero-structure of an AlGaN film and a GaN film.

In the hetero-structure of the AlGaN film and the GaN film, a high concentration of two-dimensional electron gas 30 is generated at the hetero-interface due to spontaneous polarization or piezoelectric polarization on the (0001) plane. For this reason, a sheet carrier concentration of $1\times10^{13}$ $cm^{-2}$ or more is obtained at the interface even in an undoped state.

Nitride semiconductor device 1 according to the present embodiment is a field effect transistor (FET) using two-dimensional electron gas 30 generated at the hetero-interface of AlGaN/GaN as the channel. Specifically, nitride semiconductor device 1 is a so-called vertical FET.

Nitride semiconductor device 1 according to the present embodiment is a normally-off type FET. In nitride semiconductor device 1, for example, source electrode 36 is grounded (namely, the potential is 0 V), and a positive potential is given to drain electrode 40. The potential given to drain electrode 40 is 100 V or more and 1200 V or less, for example. When nitride semiconductor device 1 is off, gate electrode 38 is 0 V or a negative potential (e.g., −5 V) is applied thereto. When nitride semiconductor device 1 is on, a positive potential (e.g., +5 V) is applied to gate electrode 38. Nitride semiconductor device 1 may be a normally-on type FET.

Configuration of Transistor Portion

Hereinafter, the configuration of transistor portion 2 in nitride semiconductor device 1 will be described.

Substrate 10 is made of a nitride semiconductor, and has first main surface 10*a* and second main surface 10*b* opposite to each other as illustrated in FIG. 1. First main surface 10*a* is a main surface (top surface) on which drift layer 12 is formed. Specifically, first main surface 10*a* approximately corresponds to the c-plane. Second main surface 10*b* is a main surface (bottom surface) on which drain electrode 40 is formed. The shape of substrate 10 in planar view is a rectangular shape, for example, but substrate 10 can be in any other shape.

For example, substrate 10 is a substrate made of $n^{+}$-type GaN with a thickness of 300 μm and a carrier concentration of $1\times10^{18}$ $cm^{-3}$. The n-type and p-type each indicate a conductivity type of a semiconductor. The $n^{+}$-type indicates that the semiconductor is doped with a high concentration of an n-type dopant, or is heavily doped. The $n^{-}$-type indicates that the semiconductor is doped with a low concentration of an n-type dopant, or is lightly doped. The same is applied to the $p^{+}$-type and $p^{-}$-type. The n-type, $n^{+}$-type, and $n^{-}$-type are one examples of the first conductivity type. The p-type, $p^{+}$-type, and $p^{-}$-type are one examples of the second conductivity type. The second conductivity type is the conductivity type having a polarity opposite to that of the first conductivity type.

Substrate 10 need not to be a nitride semiconductor substrate. For example, substrate 10 may be a silicon (Si) substrate, a silicon carbide (SiC) substrate, or a zinc oxide (ZnO) substrate.

Drift layer 12 is one example of the first semiconductor layer of the first conductivity type disposed above substrate 10. For example, drift layer 12 is a film made of $n^{-}$-type GaN with a thickness of 8 μm. The donor concentration of drift layer 12 is, for example, in the range of $1\times10^{15}$ $cm^{-3}$ or more and $1\times10^{17}$ $cm^{-3}$ or less, and is $1\times10^{16}$ $cm^{-3}$ as one example. The carbon concentration (C concentration) of drift layer 12 is in the range of $1\times10^{15}$ $cm^{-3}$ or more and $2\times10^{17}$ $cm^{-3}$ or less.

For example, drift layer 12 is disposed in contact with first main surface 10*a* of substrate 10. Drift layer 12 is formed on first main surface 10*a* of substrate 10, for example, by crystal growth such as metalorganic vapor phase epitaxy (MOVPE).

First basecoat layer 14 is one example of the second semiconductor layer of the second conductivity type disposed above drift layer 12. First basecoat layer 14 is a film made of p-type GaN with a thickness of 400 nm and a carrier concentration of $1\times10^{17}$ $cm^{-3}$, for example. First basecoat layer 14 is disposed in contact with the top surface of drift layer 12. First basecoat layer 14 is formed above drift layer 12 by crystal growth such as MOVPE, for example. First basecoat layer 14 may be formed by ion injecting magnesium (Mg) into an undoped GaN film formed. Here, the term "undoped" means that GaN is not doped with a dopant for changing the polarity of GaN to the n-type or p-type, such as Si or Mg.

Intermediate high-resistance layer 16 is one example of the third semiconductor layer disposed above first basecoat layer 14. Intermediate high-resistance layer 16 is a high-resistance layer having a resistance higher than that of first basecoat layer 14. Intermediate high-resistance layer 16 is formed of an insulative or semi-insulative nitride semiconductor. Intermediate high-resistance layer 16 is a film made of GaN with a thickness of 200 nm, for example. Intermediate high-resistance layer 16 is disposed in contact with first basecoat layer 14.

Intermediate high-resistance layer 16 contains carbon (C). The carbon concentration of intermediate high-resistance layer 16 is higher than those of first basecoat layer 14 and second basecoat layer 18. For example, the carbon concentration of intermediate high-resistance layer 16 is $3\times10^{17}$ $cm^{-3}$ or more, but may be $1\times10^{18}$ $cm^{-3}$ or more.

Intermediate high-resistance layer 16 may contain silicon (Si) or oxygen (O) mixed during formation of the film in some cases. In such cases, the carbon concentration of intermediate high-resistance layer 16 is higher than the silicon concentration (Si concentration) or the oxygen concentration (O concentration). The silicon concentration or oxygen concentration of intermediate high-resistance layer 16 is, for example, $5\times10^{16}$ $cm^{-3}$ or less, but may be $2\times10^{16}$ $cm^{-3}$ or less.

Instead of or in addition to carbon, intermediate high-resistance layer 16 may contain magnesium (Mg), iron (Fe), or boron (B). Intermediate high-resistance layer 16 may contain any other impurities as long as they can increase the resistance of GaN.

Intermediate high-resistance layer 16 is formed above first basecoat layer 14 by crystal growth such as MOVPE, for example. Alternatively, intermediate high-resistance layer 16 may be formed by ion injecting an impurity into an undoped GaN film formed.

Second basecoat layer 18 is one example of the fourth semiconductor layer of the second conductivity type disposed above intermediate high-resistance layer 16. For example, second basecoat layer 18 is a film made of p-type GaN with a thickness of 200 nm and a carrier concentration of $1\times10^{17}$ $cm^{-3}$, for example. Second basecoat layer 18 is disposed in contact with the top surface of intermediate high-resistance layer 16. Second basecoat layer 18 is formed above intermediate high-resistance layer 16 by crystal growth such as MOVPE, for example. Second basecoat layer 18 may be formed by ion injecting magnesium (Mg) into an undoped GaN film formed.

Third basecoat layer 20 is an undoped semiconductor layer disposed above second basecoat layer 18. For example, third basecoat layer 20 is a film made of undoped AlGaN with a thickness of 150 nm. Third basecoat layer 20 may be a film made of GaN, InAlN, or InAlGaN. Third basecoat layer 20 is disposed in contact with the top surface of second basecoat layer 18. Third basecoat layer 20 is formed above second basecoat layer 18 by crystal growth such as MOVPE, for example. By disposing third basecoat layer 20, diffusion of a p-type impurity such as Mg from second basecoat layer 18 to electron mobility layer 26 can be suppressed.

Drift layer 12, first basecoat layer 14, intermediate high-resistance layer 16, second basecoat layer 18, and third basecoat layer 20 can be continuously formed in the same chamber.

Gate opening 22 is one example of the first opening that penetrates through third basecoat layer 20, second basecoat layer 18, intermediate high-resistance layer 16, and first basecoat layer 14 and reaches drift layer 12. Bottom 22*a* of gate opening 22 is part of the top surface of drift layer 12. As illustrated in FIG. 1, bottom 22*a* is located on a side lower than the bottom surface of first basecoat layer 14. The bottom surface of first basecoat layer 14 corresponds to the interface between first basecoat layer 14 and drift layer 12. For example, bottom 22*a* is parallel to first main surface 10*a* of substrate 10, for example.

In the present embodiment, gate opening 22 is formed such that the opening area becomes larger in a position farther away from substrate 10. Specifically, side wall 22*b* of gate opening 22 is inclined. As illustrated in FIG. 1, the cross-sectional shape of gate opening 22 is a reverse trapezoid, more specifically, a reverse isosceles trapezoid.

The tilt angle of side wall 22*b* to bottom 22*a* is in the range of 30° or more and 45° or less, for example. As the tilt angle is smaller, side wall 22*b* becomes closer to the c-plane. Thus, the film quality of electron mobility layer 26 formed along side wall 22*b* by crystal regrowth can be increased. On the other hand, a larger tilt angle can suppress an excessive increase in gate opening 22, reducing the size of nitride semiconductor device 1.

Gate opening 22 is formed as follows: drift layer 12, first basecoat layer 14, intermediate high-resistance layer 16, second basecoat layer 18, and third basecoat layer 20 are continuously formed above first main surface 10*a* of substrate 10 in this order, and part of third basecoat layer 20, part of second basecoat layer 18, part of intermediate high-resistance layer 16, and part of first basecoat layer 14 are removed to partially expose drift layer 12. At this time, by removing the surface layer portion of drift layer 12 with a predetermined thickness, bottom 22*a* of gate opening 22 is formed on a side lower than the bottom surface of first basecoat layer 14.

Third basecoat layer 20, second basecoat layer 18, intermediate high-resistance layer 16, and first basecoat layer 14 are removed by applying a resist, followed by patterning and dry etching. Specifically, the resist is patterned, and then baked. As a result, the end of the resist is inclined. Thereafter, dry etching is performed, thereby transferring the shape of the resist to form gate opening 22 whose side wall 22*b* is inclined.

Semiconductor laminate film 24 is one example of the fifth semiconductor layer having a portion thereof disposed along the inner surface of gate opening 22 and the other portion thereof disposed above second basecoat layer 18. In other words, part of semiconductor laminate film 24 is disposed along the inner surface of gate opening 22 and the other part thereof is disposed above second basecoat layer 18. Semiconductor laminate film 24 is a laminate film of electron mobility layer 26 and electron supply layer 28.

Electron mobility layer 26 is one example of the first regrowth layer disposed along the inner surface of gate opening 22. Specifically, part of electron mobility layer 26 is disposed along bottom 22*a* of gate opening 22 and side wall 22*b*, and the other part of electron mobility layer 26 is disposed above the top surface of third basecoat layer 20. Electron mobility layer 26 is a film made of undoped GaN with a thickness of 150 nm, for example. Electron mobility layer 26 may be doped with Si to have the n-type, rather than undoped.

Electron mobility layer 26 is in contact with drift layer 12 in bottom 22*a* and side wall 22*b* of gate opening 22. Electron mobility layer 26 is in contact with end faces of first basecoat layer 14, intermediate high-resistance layer 16, second basecoat layer 18, and third basecoat layer 20 in side wall 22*b* of gate opening 22. Furthermore, electron mobility layer 26 is in contact with the top surface of third basecoat layer 20. Electron mobility layer 26 is formed by crystal regrowth after gate opening 22 is formed.

Electron mobility layer 26 has a channel region of the first conductivity type. Specifically, two-dimensional electron gas 30 is generated near electron mobility layer 26 and electron supply layer 28. Two-dimensional electron gas 30 functions as the channel for electron mobility layer 26. FIG. 1 schematically illustrates two-dimensional electron gas 30 with the dashed line. Two-dimensional electron gas 30 is bent along the interface between electron mobility layer 26 and electron supply layer 28, namely, along the inner surface of gate opening 22.

Although not illustrated in FIG. 1, as a second regrowth layer, an AlN film having a thickness of about 1 nm may be disposed between electron mobility layer 26 and electron supply layer 28. The AlN film can suppress alloy scattering and improve the mobility of the channel.

Electron supply layer 28 is one example of the third regrowth layer disposed along the inner surface of gate opening 22. Electron supply layer 28 is disposed above electron mobility layer 26. Electron supply layer 28 is formed in a shape along the top surface of electron mobility layer 26 with a substantially uniform thickness. Electron supply layer 28 is a film made of undoped AlGaN with a thickness of 50 nm, for example. Electron supply layer 28 is formed by a step of forming electron mobility layer 26, followed by crystal regrowth.

Electron supply layer 28 and electron mobility layer 26 form a hetero-interface of AlGaN/GaN. Thereby, two-dimensional electron gas 30 is generated within electron mobility layer 26. Electron supply layer 28 supplies electrons to the channel region (namely, two-dimensional electron gas 30) formed in electron mobility layer 26.

Threshold adjustment layer 32 is one example of the sixth semiconductor layer of the second conductivity type disposed above semiconductor laminate film 24. Specifically, threshold adjustment layer 32 is disposed between gate electrode 38 and electron supply layer 28. Threshold adjustment layer 32 is formed in a shape along the top surface of electron supply layer 28 with a substantially uniform thickness.

For example, threshold adjustment layer 32 is a nitride semiconductor layer made of p-type GaN or AlGaN with a thickness of 100 nm and a carrier concentration of $1\times10^{17}$ $cm^{-3}$, for example. Threshold adjustment layer 32 is formed by forming electron supply layer 28, and then forming a film by regrowth using MOVPE, followed by patterning. Electron mobility layer 26, electron supply layer 28, and threshold adjustment layer 32 can be continuously formed in this order within the same chamber.

By disposing threshold adjustment layer 32, the potential of the conduction band in the channel portion is lifted. For this reason, the threshold voltage of nitride semiconductor device 1 can be increased. Thus, nitride semiconductor device 1 can be implemented as a normally-off type FET. Specifically, when a potential of 0 V is applied to gate electrode 38, nitride semiconductor device 1 can be turned off.

Source opening 34 is one example of the second opening that penetrates through semiconductor laminate film 24 and third basecoat layer 20 and reaches second basecoat layer 18 in a position spaced from gate opening 22. Source opening 34 in planar view is disposed in a position spaced from gate electrode 38.

Bottom **34*a* of source opening 34 is part of the top surface of second basecoat layer 18. As illustrated in FIG. 1, bottom 34*a* is located in a side lower than the bottom surface of third basecoat layer 20. The bottom surface of third basecoat layer 20 corresponds to the interface between third basecoat layer 20 and second basecoat layer 18. For example, bottom 34*a* is parallel to first main surface 10*a* of substrate 10**.

As illustrated in FIG. 1, source opening 34 is formed to have a predetermined opening area irrespective of the distance from substrate 10. Specifically, side wall **34*b* of source opening 34 is vertical to bottom 34*a*. In other words, the cross-sectional shape of source opening 34** is a rectangular shape.

As in gate opening 22, source opening 34 may be formed such that the opening area becomes larger in a position farther away from substrate 10. Specifically, side wall **34*b* of source opening 34 may be inclined. For example, the cross-sectional shape of source opening 34 may be a reverse trapezoid, more specifically, a reverse isosceles trapezoid. At this time, the tilt angle of side wall 34*b* to bottom 34*a* may be in the range of 30° or more and 60° or less, for example. The tilt angle of side wall 34*b* of source opening 34 may be larger than that of side wall 22*b* of gate opening 22, for example. The inclination of side wall 34*b* results in an increase in contact area between source electrode 36 and electron mobility layer 26 (two-dimensional electron gas 30), and facilitates formation of an ohmic contact. Two-dimensional electron gas 30 is exposed from side wall 34*b* of source opening 34, and its exposed portion is connected to source electrode 36**.

Source opening 34 is formed, for example, by performing a step of forming threshold adjustment layer 32 (namely, a crystal regrowth step), and subsequently etching threshold adjustment layer 32, electron supply layer 28, electron mobility layer 26, and third basecoat layer 20 to expose second basecoat layer 18 in a region different from gate opening 22. At this time, bottom **34*a* of source opening 34 is formed on a side lower than the bottom surface of third basecoat layer 20 by also removing the surface layer portion of second basecoat layer 18. Source opening 34** is formed into a predetermined shape by patterning by photolithography and dry etching, for example.

Source electrode 36 is spaced from gate electrode 38. In the present embodiment, source electrode 36 is disposed along the inner surface of source opening 34. Specifically, source electrode 36 is connected to electron supply layer 28, electron mobility layer 26, and second basecoat layer 18. Source electrode 36 forms an ohmic contact with electron mobility layer 26 and electron supply layer 28. Source electrode 36 is in direct contact with two-dimensional electron gas 30 in side wall **34*b*. Such a configuration can reduce the contact resistance between source electrode 36 and two-dimensional electron gas 30** (channel).

Source electrode 36 is formed using a conductive material such as a metal. For example, a material that forms an ohmic contact with an n-type GaN layer by a heat treatment, such as Ti/AI, can be used as the material for source electrode 36. Source electrode 36 is formed, for example, by forming a conductive film by sputtering or deposition, and then patterning the conductive film.

Gate electrode 38 is disposed above threshold adjustment layer 32. Specifically, gate electrode 38 is disposed in contact with the top surface of threshold adjustment layer 32 to cover gate opening 22. Gate electrode 38 is formed in a shape along the top surface of threshold adjustment layer 32 with a substantially uniform film thickness, for example. Alternatively, gate electrode 38 may be formed to bury depressions on the top surface of threshold adjustment layer 32.

Gate electrode 38 is formed using a conductive material such as a metal. For example, gate electrode 38 is formed using palladium (Pd). As the material for gate electrode 38, a material that forms a Shottky contact with a p-type GaN layer can be used, and nickel (Ni)-based material, tungsten silicide (WSi), or gold (Au) can be used, for example. Gate electrode 38 is formed as follows: for example, threshold adjustment layer 32 is formed, source opening 34 or source electrode 36 is formed, and then, a conductive film formed by sputtering or deposition is patterned.

Drain electrode 40 is disposed on the side of the bottom surface of substrate 10, namely, on the side opposite to drift layer 12. Specifically, drain electrode 40 is disposed in contact with second main surface **10*b* of substrate 10. Drain electrode 40 is formed using a conductive material such as a metal. As the material for drain electrode 40, a material that forms an ohmic contact with an n-type GaN layer, such as Ti/AI, can be used as in the material for source electrode 36. Drain electrode 40** is formed, for example, by patterning a conductive film formed by sputtering or deposition.

Configuration of End Portion

Subsequently, the configuration of end portion 3 of nitride semiconductor device 1 according to the present embodiment will be described.

As illustrated in FIG. 1, end portion 3 does not include third basecoat layer 20, semiconductor laminate film 24, and threshold adjustment layer 32. For example, third basecoat layer 20, semiconductor laminate film 24, and threshold adjustment layer 32 in end portion 3 are removed simultaneously with formation of source opening 34. In end portion 3, the top surface of second basecoat layer 18 is located at the same height as that of bottom **34*a* of source opening 34. The term "same height" means that these have the same distance from first main surface 10*a* of substrate 10**.

In end portion 3, groove portion 42 is disposed. Groove portion 42 is an isolation trench for defining and separating transistor portion 2. Groove portion 42 penetrates through second basecoat layer 18, intermediate high-resistance layer 16, and first basecoat layer 14 and reaches drift layer 12.

Groove portion 42 has bottom 42*a* and side wall 42*b*. In the present embodiment, groove portion 42 is a recessed portion having side wall 42*b* only on the side of transistor portion 2. In other words, bottom 42*a* of groove portion 42 connects to the end face of nitride semiconductor device 1. As illustrated in FIG. 2, groove portion 42 is disposed like a ring to surround transistor portion 2.

Bottom 42*a* of groove portion 42 is part of the top surface of drift layer 12. As illustrated in FIG. 1, bottom 42*a* is located on a side lower than the bottom surface of first basecoat layer 14. For example, bottom 42*a* is parallel to first main surface 10*a* of substrate 10.

As illustrated in FIG. 1, groove portion 42 is formed to have a fixed opening area irrespective of the distance from substrate 10. Specifically, side wall 42*b* of groove portion 42 is vertical to bottom 42*a*. In other words, the cross-sectional shape of groove portion 42 is a rectangular shape.

Groove portion 42 is formed, for example, by forming source opening 34 in a dry etching step, changing the etching mask, and performing dry etching. Alternatively, after source electrode 36 or gate electrode 38 is formed, groove portion 42 may be formed by dry etching.

Main Characteristic Configuration

Subsequently, the main characteristic configuration of nitride semiconductor device 1 according to the present embodiment will be described.

As illustrated in FIG. 1, in nitride semiconductor device 1, a stack structure of p-type first basecoat layer 14, intermediate high-resistance layer 16, and p-type second basecoat layer 18 is disposed between source electrode 36 and drain electrode 40. In other words, intermediate high-resistance layer 16 having a high resistance is interposed between two p-type semiconductor layers.

As described above, intermediate high-resistance layer 16 is a nitride semiconductor layer made of GaN or the like, whose resistance is increased by doping an impurity such as carbon. The impurity doped may generate a trap level within intermediate high-resistance layer 16.

In the present embodiment, second basecoat layer 18 disposed above intermediate high-resistance layer 16 obstructs trap of electrons in the channel at the trap level of intermediate high-resistance layer 16. This can suppress a reduction in dynamic characteristics of transistor portion 2.

Moreover, first basecoat layer 14 is disposed below intermediate high-resistance layer 16. By disposing first basecoat layer 14, the leakage current between source electrode 36 and drain electrode 40 can be suppressed. For example, when a reverse voltage is applied to the pn junction formed by first basecoat layer 14 and drift layer 12, specifically, when the potential of drain electrode 40 is higher than that of source electrode 36, a deletion layer expands to drift layer 12. This can increase the breakdown voltage of nitride semiconductor device 1. As described above, in the present embodiment, the potential of drain electrode 40 is higher than that of source electrode 36 both in the off state and in the on state. For this reason, nitride semiconductor device 1 can have a higher breakdown voltage.

To be noted, even if the purpose is only for suppressing the above-mentioned trap of electrons by intermediate high-resistance layer 16, it can also be considered that intermediate high-resistance layer 16 is disposed between first basecoat layer 14 and drift layer 12. However, the crystal quality of intermediate high-resistance layer 16 tends to be reduced due to doping with carbon or the like. For this reason, the off properties may be reduced when intermediate high-resistance layer 16 is disposed in the pn bonding portion to which a high electric field is applied when the device is off. In the present embodiment, a reduction in off properties can be suppressed by disposing intermediate high-resistance layer 16 above first basecoat layer 14.

If nitride semiconductor device 1 does not include intermediate high-resistance layer 16, a parasitic npn structure of electron mobility layer 26, p-type first basecoat layer 14 and second basecoat layer 18, and n-type drift layer 12, i.e., a parasitic bipolar transistor is present between source electrode 36 and drain electrode 40. For this reason, when nitride semiconductor device 1 is in the off state and a current flows in p-type first basecoat layer 14 or second basecoat layer 18, this parasitic bipolar transistor may be turned on to reduce the breakdown voltage of nitride semiconductor device 1. In such a case, malfunction of nitride semiconductor device 1 is likely to occur. In the present embodiment, by disposing intermediate high-resistance layer 16, formation of the parasitic npn structure can be suppressed, and thus the malfunction of nitride semiconductor device 1 can be suppressed.

In the present embodiment, source opening 34 that reaches second basecoat layer 18 is disposed. Because the channel (two-dimensional electron gas 30) is exposed from side wall 34*b* of source opening 34, source electrode 36 can be in contact with this exposed portion of the channel. For this reason, the ohmic contact resistance between source electrode 36 and the channel can be reduced.

Since intermediate high-resistance layer 16 is disposed below second basecoat layer 18 that is in contact with source electrode 36 on bottom 34*a* of source opening 34, flow of a current in the parasitic pn diode formed between the source and the drain can be suppressed. Such a configuration can improve the reliability of nitride semiconductor device 1.

Distance D1 illustrated in FIG. 1 is shorter than distance D2. Distance D1 is the distance between bottom 28*a* of electron supply layer 28 and drain electrode 40. Distance D2 is the distance between bottom 16*a* of intermediate high-resistance layer 16 and drain electrode 40.

Bottom 28*a* of electron supply layer 28 is the portion of the bottom surface of electron supply layer 28 closest to drain electrode 40. Specifically, in the bottom surface of electron supply layer 28, bottom 28*a* is a portion that is located within gate opening 22 and is parallel to bottom 22*a* of gate opening 22. Bottom 16*a* of intermediate high-resistance layer 16 is the portion of the bottom surface of intermediate high-resistance layer 16 closest to drain electrode 40. In the present embodiment, since the bottom surface of intermediate high-resistance layer 16 is parallel to the top surface of drain electrode 40 (second main surface 10*b* of substrate 10), bottom 16*a* is any part of the bottom surface of intermediate high-resistance layer 16.

Electron mobility layer 26 and electron supply layer 28 can be continuously formed by crystal growth. For this reason, the pn bonding portion at the interface between electron mobility layer 26 and electron supply layer 28, that is, bottom 28*a* of electron supply layer 28 is a portion that can endure the highest electric field strength within nitride semiconductor device 1 with few levels attributed to impurities or damage. By disposing bottom 28*a* of electron supply layer 28 close to drain electrode 40, the electric field generated between gate electrode 38 or source electrode 36 and drain electrode 40 when the device is off can be concentrated on bottom 28_a_ of electron supply layer 28. Thereby, concentration of the electric field on weak portions can be suppressed, and the off properties can be improved.

MODIFICATION

Figure 3:
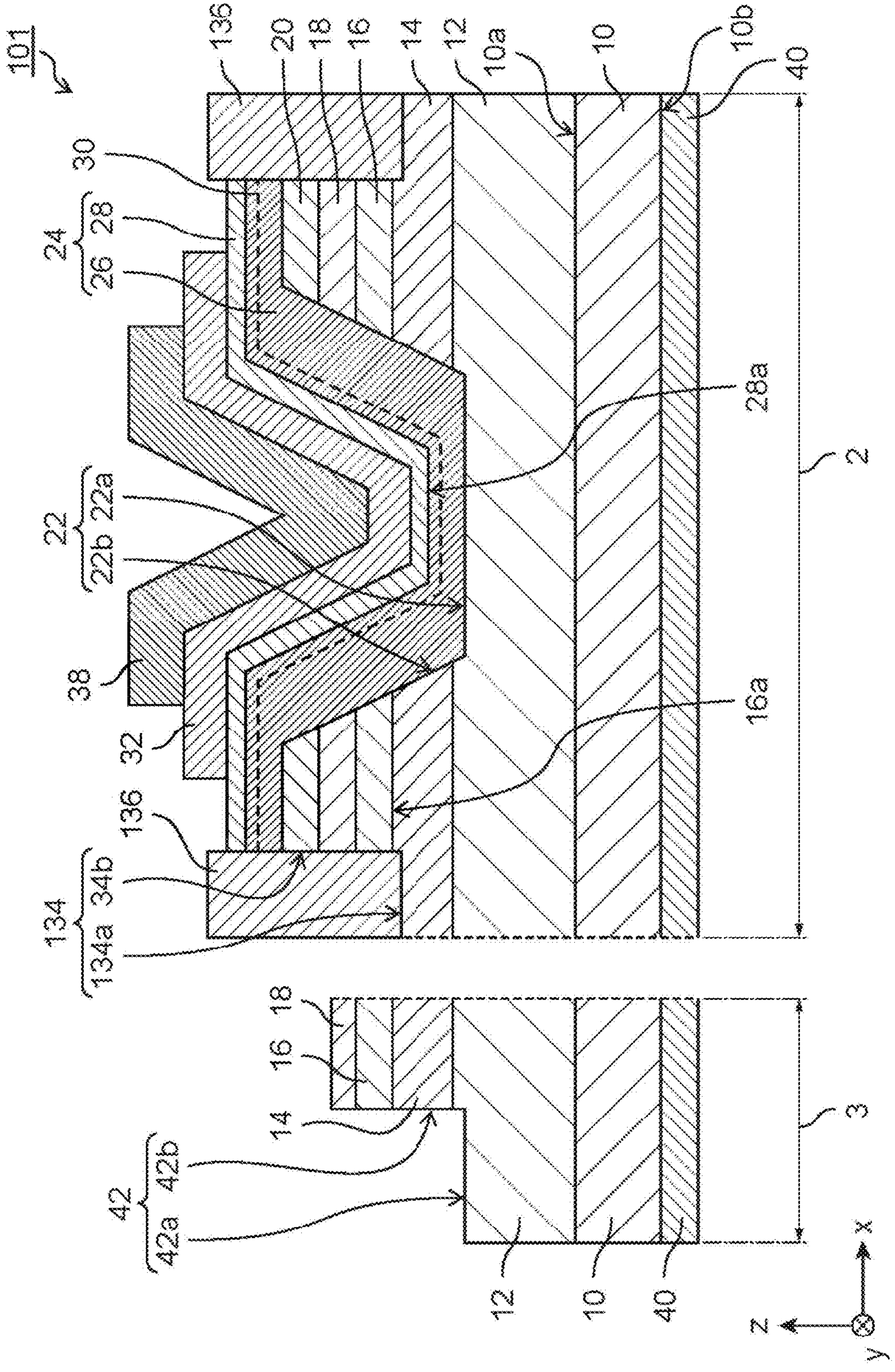
FIG. 3 is a cross-sectional view of the nitride semiconductor device according to a modification of Embodiment 1.

Subsequently, a modification of Embodiment 1 will be described with reference to FIG. 3. FIG. 3 is a cross-sectional view of nitride semiconductor device 101 according to a modification of the present embodiment.

Unlike nitride semiconductor device 1 illustrated in FIG. 1, nitride semiconductor device 101 includes source opening 134 and source electrode 136 instead of source opening 34 and source electrode 36 as illustrated in FIG. 3. Hereinafter, differences from the embodiment will be mainly described, and the descriptions of configurations in common will be omitted or simplified.

Source opening 134 is one example of the third opening that penetrates through semiconductor laminate film 24, third basecoat layer 20, second basecoat layer 18, and intermediate high-resistance layer 16 and reaches first basecoat layer 14 in a position spaced from gate opening 22. Source opening 134 in planar view is disposed in a position spaced from gate electrode 38.

Bottom 134_a_ of source opening 134 is part of the top surface of first basecoat layer 14. As illustrated in FIG. 3, bottom 134_a_ is located on a side lower than the bottom surface (bottom 16_a_) of intermediate high-resistance layer 16. The bottom surface of intermediate high-resistance layer 16 corresponds to the interface between intermediate high-resistance layer 16 and first basecoat layer 14.

Thus, in the present modification, source opening 134 reaches first basecoat layer 14. Since source electrode 136 is disposed along the inner surface of source opening 134, source electrode 136 is in contact with first basecoat layer 14. Specifically, source electrode 136 is connected to electron supply layer 28, electron mobility layer 26, second basecoat layer 18, and first basecoat layer 14.

In this configuration, since the channel (two-dimensional electron gas 30) is exposed from side wall 34_b_ of source opening 134 as in the embodiment, this exposed portion of source electrode 136 can be in contact with the channel. For this reason, the ohmic contact resistance between source electrode 136 and the channel can be reduced.

Moreover, since source electrode 136 is in contact with both of second basecoat layer 18 and first basecoat layer 14, the potentials of these layers can be firmly fixed. Thereby, the off properties of nitride semiconductor device 1 can be further improved.

Second basecoat layer 18 and intermediate high-resistance layer 16 may be arranged in end portion 3. In other words, in end portion 3, second basecoat layer 18 and intermediate high-resistance layer 16 may be removed simultaneously with formation of source opening 134, and the top surface of first basecoat layer 14 may be exposed.

Embodiment 2

Subsequently, Embodiment 2 will be described.

Unlike Embodiment 1, the nitride semiconductor device according to Embodiment 2 includes drift layers having different impurity concentrations. Hereinafter, differences from Embodiment 1 and its modification will be mainly described, and the descriptions of configurations in common will be omitted or simplified.

Configuration

Figure 4:
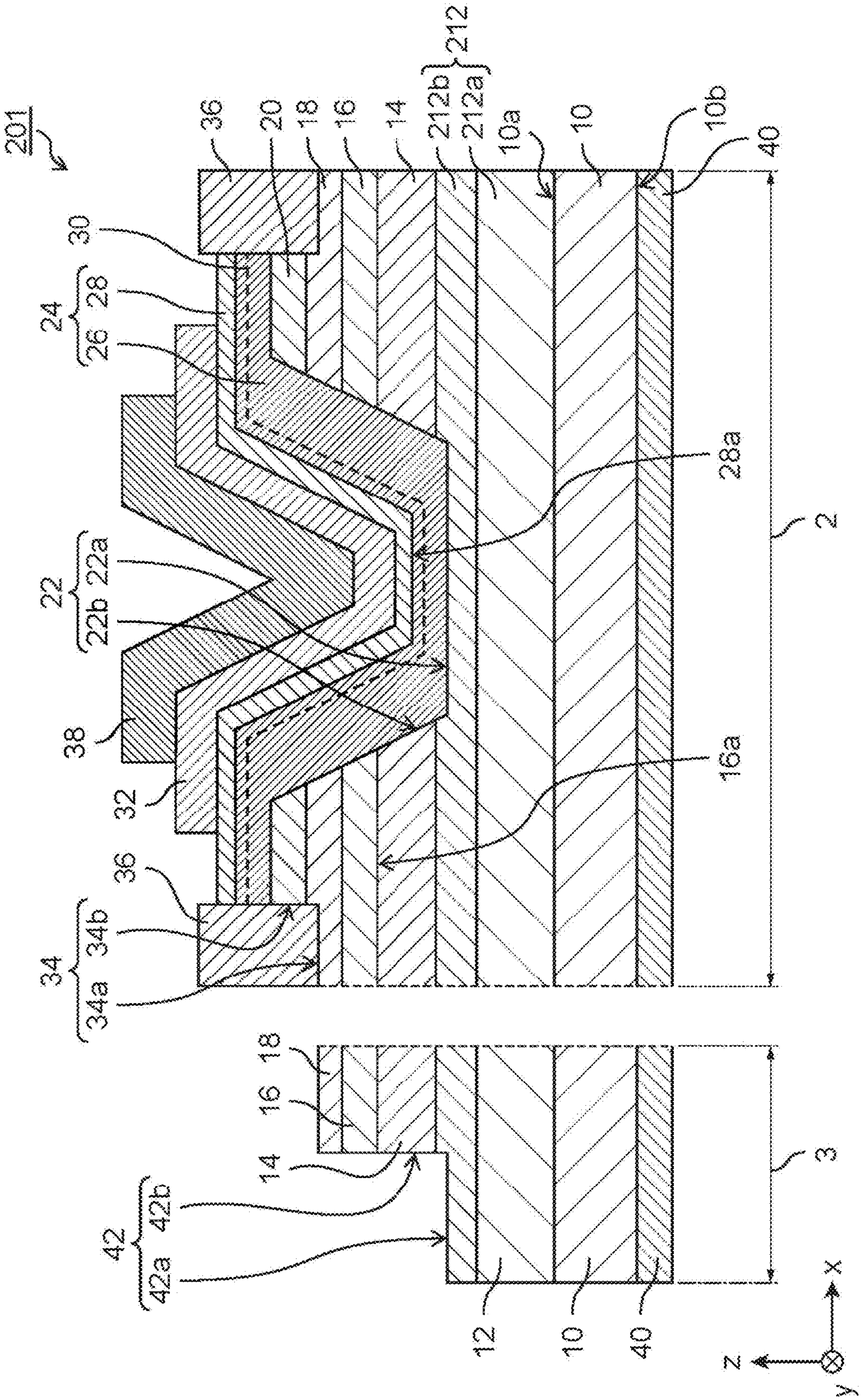
FIG. 4 is a cross-sectional view of the nitride semiconductor device according to Embodiment 2.

First, the configuration of the nitride semiconductor device according to the present embodiment will be described with reference to FIG. 4. FIG. 4 is a cross-sectional view of nitride semiconductor device 201 according to the present embodiment.

Unlike nitride semiconductor device 1 according to Embodiment 1, nitride semiconductor device 201 includes drift layer 212 instead of drift layer 12 as illustrated in FIG. 4.

Drift layer 212 includes layers having different impurity concentrations. In the present embodiment, the layers include two layers. Specifically, as illustrated in FIG. 3, drift layer 212 includes high-concentration layer 212_a_ and low-concentration layer 212_b_. High-concentration layer 212_a_ and low-concentration layer 212_b_ are continuously formed above substrate 10 by crystal growth such as MOVPE, for example.

High-concentration layer 212_a_ is one example of the n-th layer from above among the layers from above. n is a natural number of 2 or more. In the present embodiment, n is 2. High-concentration layer 212_a_ is disposed in contact with first main surface 10_a_ of substrate 10.

High-concentration layer 212_a_ is a film made of $n^+$-type GaN with a thickness of 7 μm, for example. The impurity concentration (donor concentration) of high-concentration layer 212_a_ is, for example, in the range of $3\times10^{15}$ $cm^{-3}$ or more and $5\times10^{16}$ $cm^{-3}$ or less, and is $1.5\times10^{16}$ $cm^{-3}$ as one example.

Low-concentration layer 212_b_ is one example of the layer located above the n-th layer. In the present embodiment, low-concentration layer 212_b_ is the topmost layer within drift layer 212, and is disposed in contact with high-concentration layer 212_a_ and first basecoat layer 14. The impurity concentration of low-concentration layer 212_b_ is the lowest among the layers constituting drift layer 212. In other words, the impurity concentration of low-concentration layer 212_b_ is lower than that of high-concentration layer 212_a_.

Low-concentration layer 212_b_ is a film made of $n^-$-type GaN with a thickness of 1 μm, for example. The impurity concentration (donor concentration) of low-concentration layer 212_b_ is, for example, in the range of $1\times10^{15}$ $cm^{-3}$ or more and $3\times10^{16}$ $cm^{-3}$ or less, and is $9\times10^{15}$ $cm^{-3}$ as one example.

Thus, by controlling the impurity concentration of low-concentration layer 212_b_ on the side of first basecoat layer 14 (upper side) to be lower than the donor concentration of high-concentration layer 212_a_ in the side close to substrate 10 (lower side), expansion of the deletion layer into drift layer 212 is promoted when a high voltage is applied to drain electrode 40 in the off state. Thereby, the breakdown voltage of nitride semiconductor device 201 can be increased.

Modification 1

Figure 5:
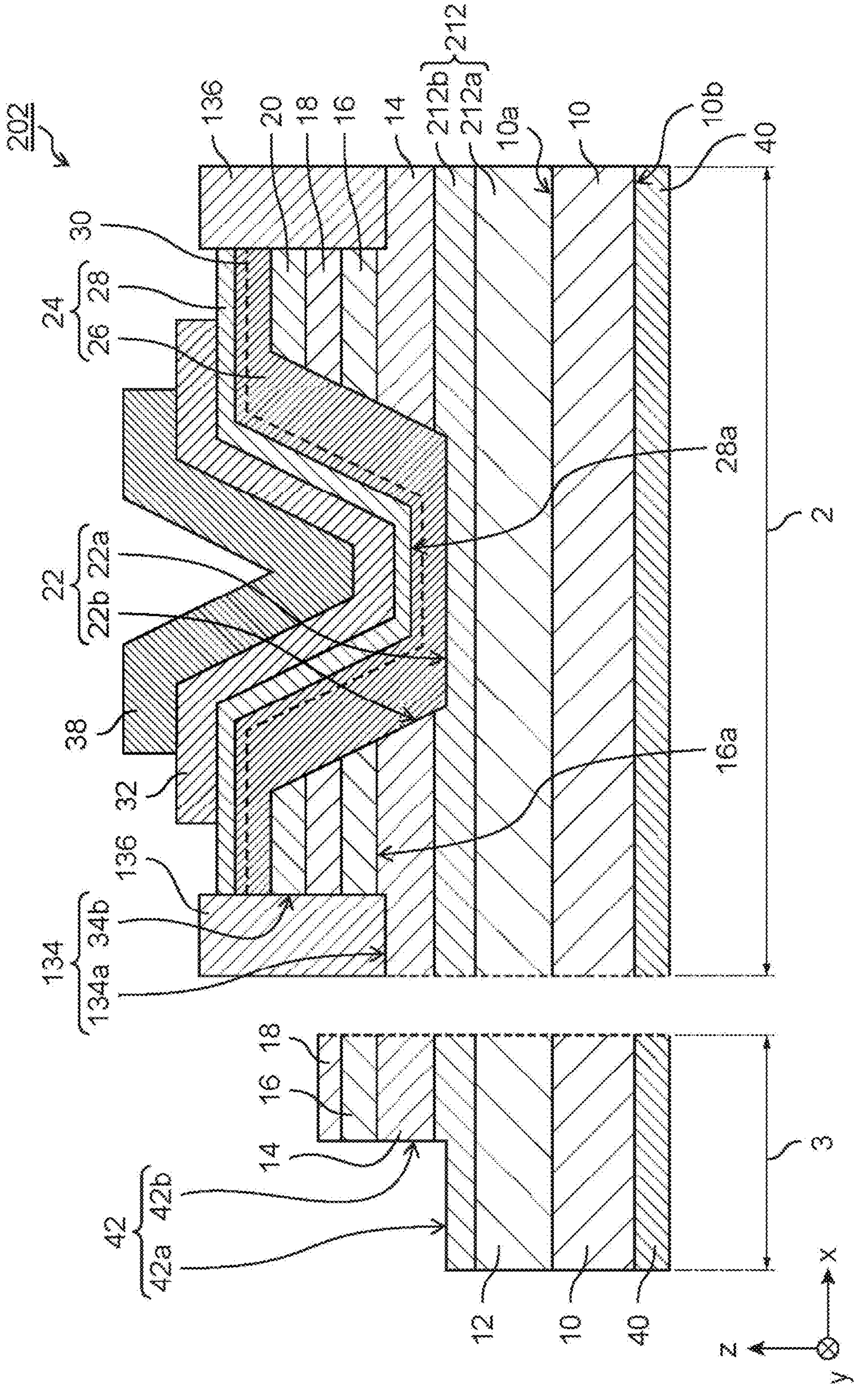
FIG. 5 is a cross-sectional view of the nitride semiconductor device according to Modification 1 of Embodiment 2.

Subsequently, Modification 1 of Embodiment 2 will be described with reference to FIG. 5. FIG. 5 is a cross-sectional view of nitride semiconductor device 202 according to the present modification.

Unlike nitride semiconductor device 201 illustrated in FIG. 4, nitride semiconductor device 202 includes source opening 134 and source electrode 136 instead of source opening 34 and source electrode 36 as illustrated in FIG. 5. Source opening 134 and source electrode 136 are identical with source opening 134 and source electrode 136 according to a modification of Embodiment 1.

Accordingly, nitride semiconductor device 202 according to the present modification can provide the effects of both of nitride semiconductor devices 101 and 201. Specifically, nitride semiconductor device 202 can further improve the off properties, and can increase the breakdown voltage.

Modification 2

Figure 6:
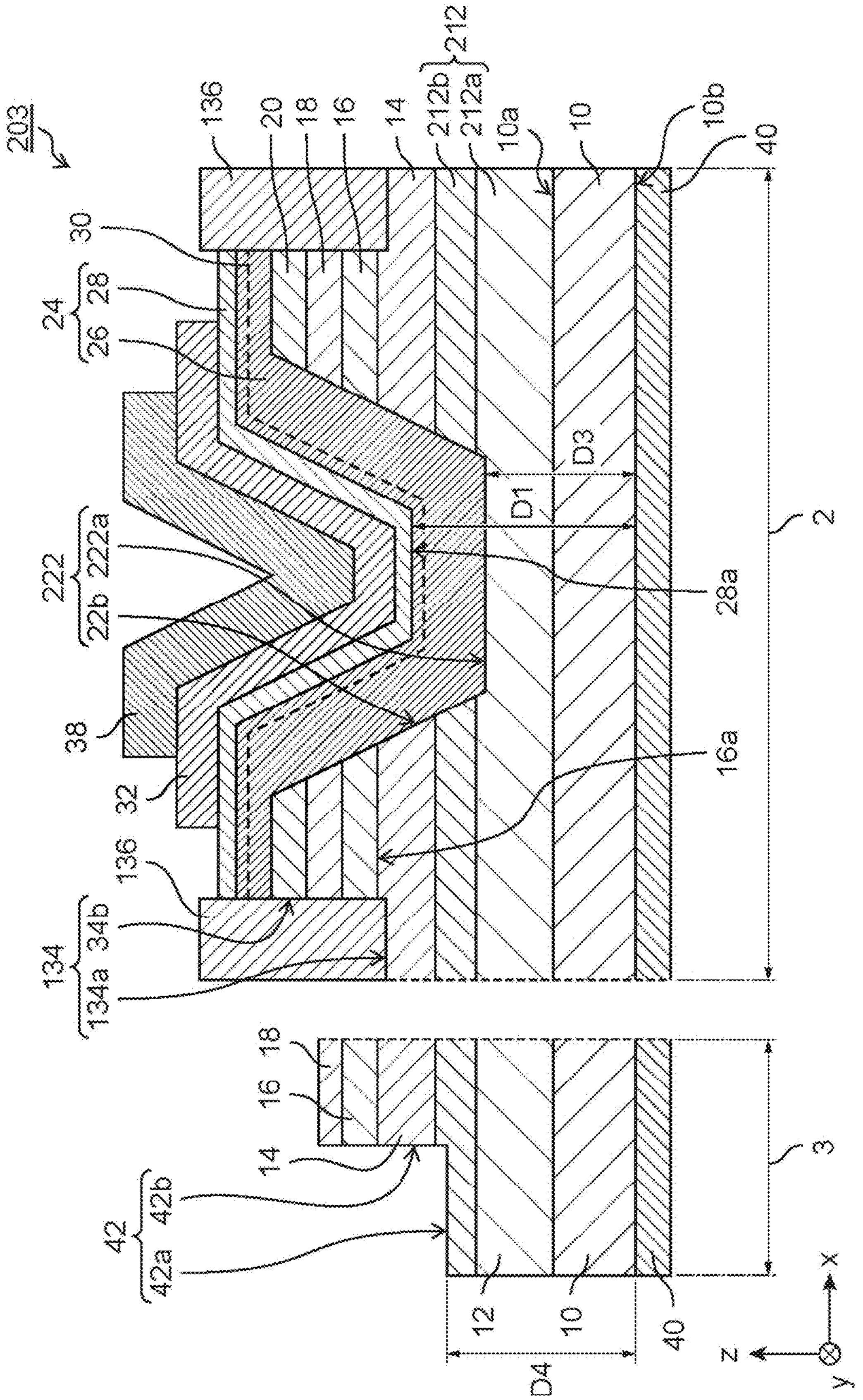
FIG. 6 is a cross-sectional view of the nitride semiconductor device according to Modification 2 of Embodiment 2.

Subsequently, Modification 2 of Embodiment 2 will be described with reference to FIG. 6. FIG. 6 is a cross-sectional view nitride semiconductor device 203 according to the present modification.

Unlike nitride semiconductor device 202 illustrated in FIG. 5, nitride semiconductor device 203 includes gate opening 222 instead of gate opening 22 as illustrated in FIG. 6.

Gate opening 222 penetrates through third basecoat layer 20, second basecoat layer 18, intermediate high-resistance layer 16, first basecoat layer 14, and low-concentration layer 212*b* and reaches high-concentration layer 212*a*. Bottom 222*a* of gate opening 222 is part of the top surface of high-concentration layer 212*a*. As illustrated in FIG. 1, bottom 222*a* is located in a side lower than the bottom surface of low-concentration layer 212*b*. The bottom surface of low-concentration layer 212*b* corresponds to the interface between low-concentration layer 212*b* and high-concentration layer 212*a*.

Thereby, the drain current in the on state flows from drain electrode 40 through substrate 10, high-concentration layer 212*a* and two-dimensional electron gas 30 to source electrode 36. Since low-concentration layer 212*b* having a high resistance is not present on the drain current path, the on-resistance can be reduced.

In the present modification, distance D3 illustrated in FIG. 6 is shorter than distance D4. Distance D3 is the distance between bottom 222*a* of gate opening 222 and drain electrode 40. Distance D4 is the distance between bottom 42*a* of groove portion 42 and drain electrode 40. Such a configuration can improve the off properties of nitride semiconductor device 203. Specifically, the off properties can be improved as follows.

When transistor portion 2 is in the off state, a high voltage is applied between drain electrode 40 and source electrode 136 to control the potential of drain electrode 40 to be higher than that of source electrode 136. For this reason, in the off state, a high electric field is generated in the longitudinal direction of nitride semiconductor device 203.

Since distance D3 is shorter than distance D4, the electric field is likely to concentrate on gate opening 222 of transistor portion 2 rather than on end portion 3. The concentration of the electric field can be received by the pn junction between electron supply layer 28 and electron mobility layer 26. This pn junction has quality and electric field strength higher than those of the pn junction between first basecoat layer 14 and drift layer 212 in the vicinity of groove portion 42 subjected to etching damage. Since the concentration of the electric field can be received by the pn junction having high electric field strength, the concentration of the electric field on the pn junction near groove portion 42 can be relaxed.

Thus, the off properties of nitride semiconductor device 203 can be improved. Specifically, the leakage current in the vicinity of groove portion 42 can be reduced, and a reduction in breakdown voltage can be suppressed. A larger difference between distance D3 and distance D4 results in more relaxation of the concentration of the electric field on the vicinity of groove portion 42.

In the present embodiment, distance D1 may be shorter than distance D4. Such a configuration can relax the concentration of the electric field on the vicinity of groove portion 42.

Although drift layer 212 configured with two stacked layers has been described as an example, the number of stacked layers may be three or more layers. When drift layer 212 includes three or more semiconductor layers, bottom 222*a* of gate opening 222 is located in a position corresponding to a layer other than the topmost layer having the lowest impurity concentration. In other words, bottom 222*a* is located in a position corresponding to the n-th (where n is a natural number of 2 or more) layer from above among the layers constituting drift layer 212.

OTHER EMBODIMENTS

As above, the nitride semiconductor devices according to one or more aspects have been described based on the embodiments, but the present disclosure is not limited to these embodiments. A variety of modifications of the present embodiments conceived by persons skilled in the art and embodiments constituted of combinations of the components in different embodiments are also included in the scope of the present disclosure without departing the gist of the present disclosure.

For example, source opening 34 or 134 need not be disposed. In this case, source electrode 36 or 136 is disposed in a position away from threshold adjustment layer 32 on the top surface of semiconductor laminate film 24.

For example, drift layer 12 may have a graded structure in which the impurity concentration (donor concentration) is gradually reduced from the side of substrate 10 to the side of first basecoat layer 14. The donor concentration may be controlled by Si serving as a donor, or may be controlled by carbon serving as an acceptor which compensates for Si.

Moreover, for example, end portion 3 need not contain the end face of the nitride semiconductor device. End portion 3 is a portion for separating transistor portion 2 from another device. Another element may be disposed in a region adjacent to transistor portion 2 with end portion 3 interposed therebetween. For example, another element is a pn diode using the pn junction between drift layer 12 and first basecoat layer 14. In this case, nitride semiconductor device includes transistor portion 2, end portion 3, and a pn diode.

The first conductivity type may be the p-type, $p^+$-type, and $p^-$-type, and the second conductivity type may be the n-type, $n^+$-type, and $n^-$-type.

The embodiments described above can be subjected to a variety of modifications, replacements, additions, and omissions within the scope defined in CLAIMS or its equivalents.

INDUSTRIAL APPLICABILITY

The present disclosure can be used as a nitride semiconductor device having improved off properties, and can be used in power devices used in power supply circuits for consumer products, for example.

The invention claimed is:

1. A nitride semiconductor device comprising:

a substrate;

a first semiconductor layer of a first conductivity type disposed above the substrate;

a second semiconductor layer of a second conductivity type disposed above the first semiconductor layer;

a third semiconductor layer that is disposed above the second semiconductor layer and has a resistance higher than a resistance of the second semiconductor layer;

a fourth semiconductor layer of the second conductivity type disposed above the third semiconductor layer;

a fifth semiconductor layer including a channel region of the first conductivity type, a portion of the fifth semiconductor layer being disposed along an inner surface of a first opening and an other portion of the fifth semiconductor layer being disposed above the fourth semiconductor layer, the first opening penetrating through the fourth semiconductor layer, the third semiconductor layer, and the second semiconductor layer and reaching the first semiconductor layer;

a sixth semiconductor layer of the second conductivity type disposed above the fifth semiconductor layer;

a gate electrode disposed above the sixth semiconductor layer;

a source electrode spaced from the gate electrode; and a drain electrode disposed below a bottom surface of the substrate.

2. The nitride semiconductor device according to claim 1, wherein the fifth semiconductor layer includes an electron mobility layer, and an electron supply layer disposed above the electron mobility layer, and a distance between a bottom of the electron supply layer and the drain electrode is shorter than a distance between a bottom of the third semiconductor layer and the drain electrode.

3. The nitride semiconductor device according to claim 1, wherein the source electrode is disposed along an inner surface of a second opening that is spaced from the gate electrode, and penetrates through the fifth semiconductor layer and reaches the fourth semiconductor layer.

4. The nitride semiconductor device according to claim 1, wherein the source electrode is disposed along an inner surface of a third opening that is spaced from the gate electrode, and penetrates through the fifth semiconductor layer, the fourth semiconductor layer, and the third semiconductor layer, and reaches the second semiconductor layer.

5. The nitride semiconductor device according to claim 1, wherein the third semiconductor layer contains at least one of C, Fe, B, or Mg.

6. The nitride semiconductor device according to claim 1, wherein the first semiconductor layer includes layers having different impurity concentrations, and a topmost layer of the layers has a lowest impurity concentration among the layers.

7. The nitride semiconductor device according to claim 6, wherein a bottom of the first opening is located in a position corresponding to an n-th layer from above among the layers, where n is a natural number of 2 or more.

8. The nitride semiconductor device according to claim 1, wherein a groove portion that reaches the first semiconductor layer is disposed in an end portion of the nitride semiconductor device.

9. The nitride semiconductor device according to claim 8, wherein a distance between the bottom of the first opening and the drain electrode is shorter than a distance between a bottom of the groove portion and the drain electrode.

* * * * *